United States Patent [19]

Seyfang

[11] Patent Number: 4,949,046
[45] Date of Patent: Aug. 14, 1990

[54] BATTERY STATE OF CHARGE INDICATOR

[75] Inventor: George R. Seyfang, Lancashire, England

[73] Assignee: British Aerospace Public Limited Company, London, England

[21] Appl. No.: 210,166

[22] Filed: Jun. 21, 1988

Related U.S. Application Data

[63] Continuation of Ser. No. 932,144, Nov. 18, 1986, abandoned.

[30] Foreign Application Priority Data

Nov. 19, 1985 [GB] United Kingdom ................ 8528472

[51] Int. Cl.$^5$ ............................................. G01N 27/46
[52] U.S. Cl. .................................... 324/427; 324/431; 340/636
[58] Field of Search ............... 324/427, 431, 433, 432; 340/636; 320/48

[56] References Cited

U.S. PATENT DOCUMENTS

| | | | |
|---|---|---|---|
| 3,971,980 | 7/1976 | Jungfer et al. | 324/427 X |
| 3,984,762 | 10/1976 | Powgiallo, Jr. | 324/430 |
| 4,052,717 | 10/1977 | Arnold et al. | 324/432 |
| 4,275,351 | 6/1981 | Härer et al. | 324/427 |
| 4,377,787 | 3/1983 | Kikvoka et al. | 324/431 |
| 4,390,841 | 6/1983 | Martin et al. | |
| 4,517,517 | 4/1988 | Kinney | 324/433 |
| 4,535,325 | 8/1985 | Mann | 324/155 X |
| 4,558,281 | 12/1985 | Codd et al. | 324/427 X |
| 4,560,937 | 12/1985 | Finger | 340/636 X |
| 4,595,880 | 7/1986 | Patil | 324/427 |
| 4,638,237 | 1/1987 | Fernandez | 324/433 X |

FOREIGN PATENT DOCUMENTS

| | | |
|---|---|---|
| 2902334 | 1/1979 | Fed. Rep. of Germany . |
| 648936 | 12/1980 | Fed. Rep. of Germany . |
| 0164170 | 7/1986 | Japan ................ 324/427 |
| 0170678 | 8/1986 | Japan ................ 324/427 |
| 2116728 | 9/1983 | United Kingdom . |

OTHER PUBLICATIONS

Lerner, S. et al., "Development of an Alkaline Battery State of Charge Indicator," *Power Sources 3*, Collins (Ed.), Oriel Press, 1970, pp. 135–138.

Primary Examiner—William M. Shoop, Jr.
Assistant Examiner—A. Jonathan Wysocki
Attorney, Agent, or Firm—Cushman, Darby & Cushman

[57] ABSTRACT

A device for indicating changes in the state of charge of a rechargeable battery including a current sensor to sense current flow into and out of the battery and to provide an output indicative of both the magnitude and direction of the current flow, a timer to provide a timing signal, and a computer programmed to compute from the output of the current sensor and the timer, a signal representative of the charge dissipated from or accumulated in the battery over a period of time. Preferably the device includes data storage to store an indicatioin of the state of charge of the battery and the computer is programmed to use the signal to update the stored data to provide an indication of the current state of charge of the battery.

12 Claims, 6 Drawing Sheets

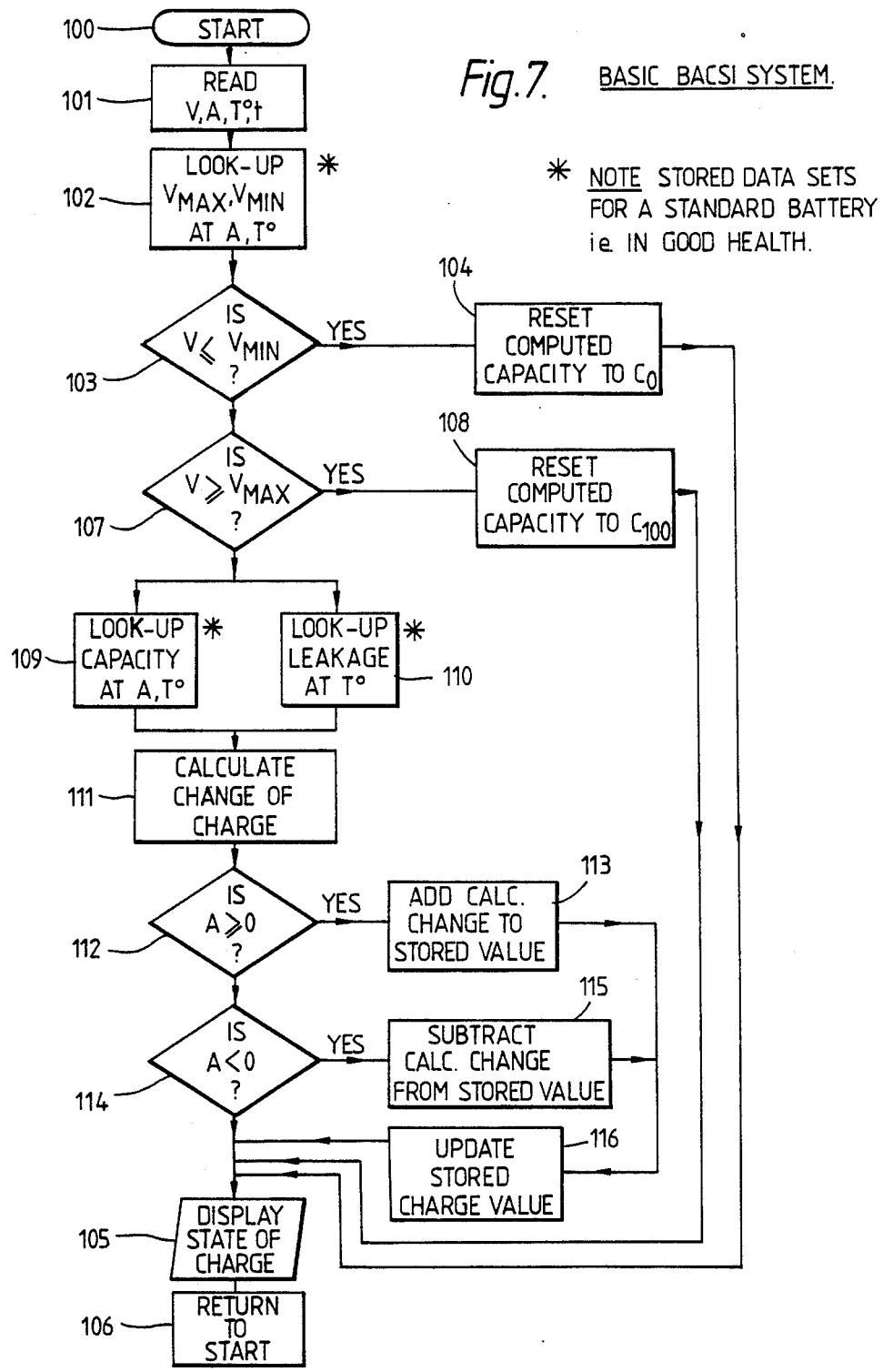

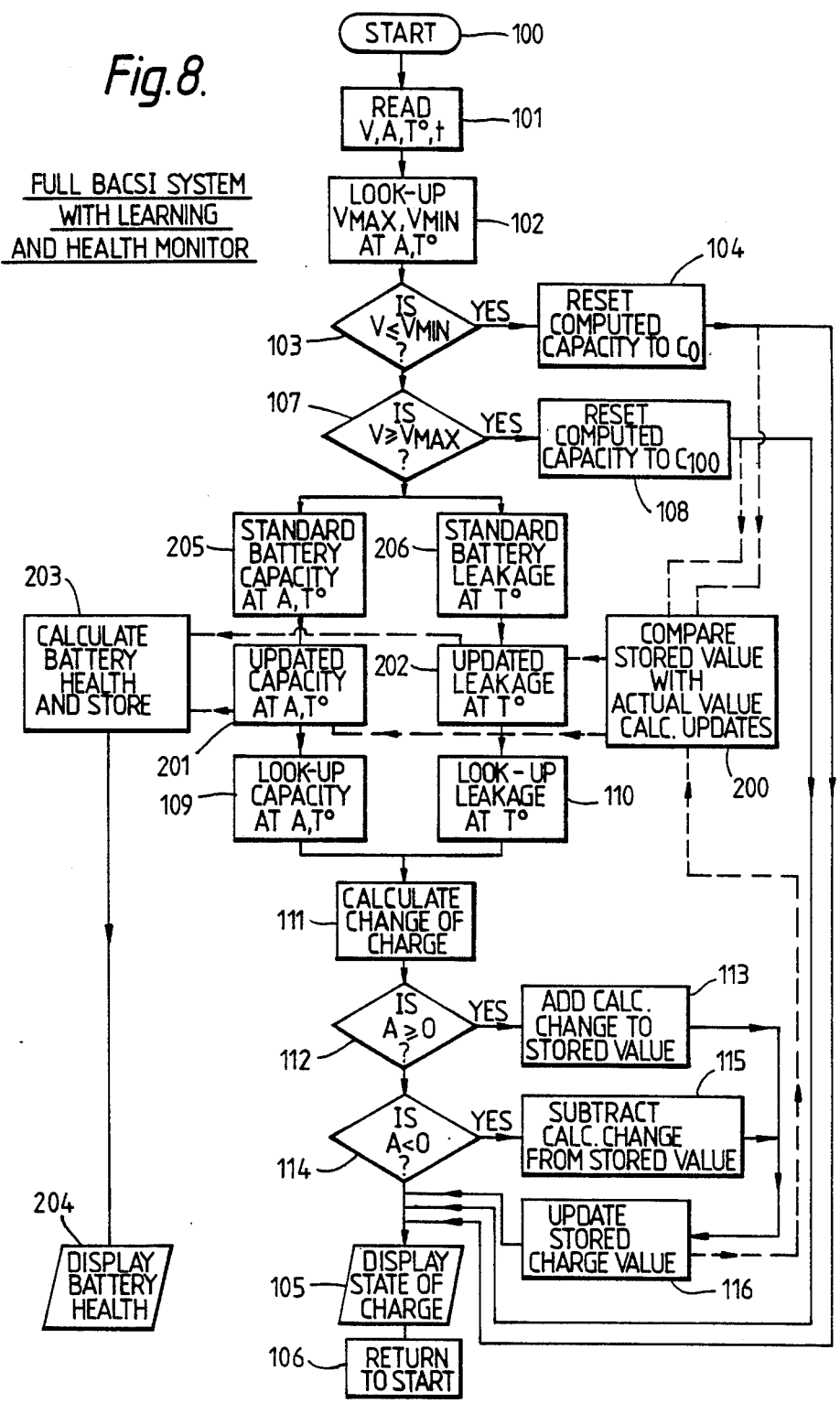

BATTERY STATE OF CHARGE INDICATOR

This is a continuation of application Ser. No. 932,144, filed Nov. 18, 1986, now abandoned.

BACKGROUND AND SUMMARY OF THE INVENTION

It is desirable to be able to indicate the state of charge of a rechargeable battery to be able to evaluate its remaining capacity and so decide whether it requires recharging.

With lead-acid batteries there is an approximately linear relationship between their state of charge and the potential difference subsisting across their output terminals. Accordingly, by monitoring the voltage appearing across the output terminals of a lead-acid battery it is possible to give a reliable indication of the state of charge of a battery. Another way in which the state of charge of a lead-acid battery can be evaluated is by taking a sample of the electrolyte and measuring its specific gravity. This also changes in an approximately linear manner with the state of charge of the battery.

However, neither of these solutions is available for nickel-cadmium batteries. With such batteries a substantially constant potential difference appears across their output terminals as they are charged from about 10% to about 95% of their full capacity. When a nickel-cadmium battery is nearly discharged the voltage appearing across its terminals rapidly falls away to a low value and when the battery is fully charged the voltage rises to a significant extent. Attempts have been made to monitor the chemical properties of the electrolyte to determine a property which shows significant changes with relation to the state of charge of the battery but these have been unsuccessful and, in any event, it would not be practical to carry out such procedures during the day-to-day operation of a nickel-cadmium battery.

An account of attempts that have been made to develop a state of charge indicator for a nickel-cadmium battery is included under the title "Development of an Alkaline Battery State of Charge Indicator" in an article by S. Lerner, H. Lennon and H. N. Seiger and appears between pages 135 and 137 in "Power Sources 3" edited by Collins and published by the Oriel Press in 1970. The conclusions of this article state that the only reliable way of estimating the state of charge is to use a current sharing method in which the current output of a battery having a known state of charge is compared with that of a battery having an unknown state of charge and, from this, the state of charge of the unknown battery is deduced. Again such techniques are clearly not readily usable since they rely upon the existence of a similar battery having a known state of charge and, in practice this has to be a fully charged battery.

According to this invention a device for indicating changes in the state of charge of a rechargeable battery comprises a current sensor to sense current flow into and out of the battery and to provide an output indicative of both the magnitude and direction of the current flow, timing means to provide a timing signal, and a computer programmed to compute from the output of the current sensor and the timing means, a signal representative of the charge dissipated from or accumulated in the battery over a period of time.

Preferably the device is capable of indicating the state of charge of the battery and, to enable it to do this it preferably includes data storage means to store an indication of the state of charge of the battery and the computer is programmed to use the signal representative of the charge dissipated from, or accumulated in, the battery over the period of time to update the stored data on the state of charge of the battery to provide an indication of the current state of charge of the battery.

Such a device provides a reliable indication of the state of charge of the battery over a reasonable number of charge and discharge cycles but any errors gradually build up over a number of cycles. Clearly there is always also doubt about the initial indication of the state of charge of the battery held in the data storage means. To overcome this preferably the device includes a voltage sensor for sensing the potential difference subsisting across the terminals of the battery and the computer is programmed to monitor an output signal of the voltage sensor and, when the monitored voltage exceeds a predetermined maximum value, reset the data storage means to indicate that the battery is fully charged. Preferably, or alternatively, the computer is programmed to monitor the output signal of the voltage sensor and detect when it falls below a predetermined minimum value to reset the data storage means to indicate that the battery is fully discharged.

The capacity of a battery is dependent upon its temperature and therefore preferably the device includes a temperature sensor having an output indicative of the temperature of the battery, or its surroundings, and the computer is programmed to modify the state of charge indication provided by the device to take account of the effect of the temperature on the battery. One of the factors which is temperature dependent is the rate of decay of the charge held by the battery when no current is being drawn from it. Under such conditions the charge on the battery gradually decays and this decay is a function of both temperature and time. Preferably the computer is programmed to take account of this decay in the charge stored by the battery.

Naturally a battery is not 100% efficient and, typical efficiencies for a nickel-cadmium battery are between 70 and 85%. Accordingly, the charge accumulated in the battery is not exactly equal to the monitored charge input and equally the conversion efficiency from stored charge to output current is also not 100% efficient. It is preferred that the computer is programmed to take account of the conversion efficiency by applying a correction factor to both the monitored charge accumulated in the battery and the monitored charge dissipated from the battery when determining the state of charge of the battery. The conversion efficiency of a nickel-cadmium battery depends upon both its rate of charge and discharge and upon the temperature of the battery. Preferably therefore the computer is programmed to take account of both the magnitude of the current being accumulated in or, dissipated from the battery, and the output of the temperature sensor when applying the correction factor to both the monitored charge accumulated in the battery and the monitored charge dissipated from the battery.

All of these factors may be based upon measured parameters of typical batteries or, alternatively, the computer may gradually tailor these correction factors to a particular battery which it is monitoring by comparing its state of charge indication immediately before it is reset with the state of charge indicated by the voltage sensor when the indication is reset, either when the battery is fully discharged or when the battery is fully charged so that the computer "learns" the particular parameters such as the conversion efficiency of each particular battery and updates this to take account of any ageing of the battery.

As a battery gradually ages its capacity reduces It is preferred therefore that the computer is also programmed to monitor the capacity of the battery and compare the monitored capacity with the initial capacity and so provide an indication of the health of the battery. Preferably the computer is programmed to provide an alarm indication when the monitored capacity of the battery has fallen to a predetermined proportion of its initial capacity to provide a warning that it needs replacement.

Whilst the present invention is particularly intended to be used with a nickel-cadmium battery it can, of course, be used with any other type of rechargeable cell if this is required.

The indication or indications provided by the computer may be displayed on a display device forming part of the equipment associated with and powered by the battery or, alternatively, the device may include its own independent display to provide an indication of the available battery capacity and any alarm indications.

BRIEF DESCRIPTION OF THE DRAWINGS

Various aspects of the present invention are illustrated in the accompanying drawings, in which:

FIG. 7 is a flow chart of a computer program used in a first of the present invention; and, FIG. 8 is a flow chart of a computer program used in the second preferred embodiment of the present invention.

DETAILED DESCRIPTION OF THE INVENTION

Figure 1:
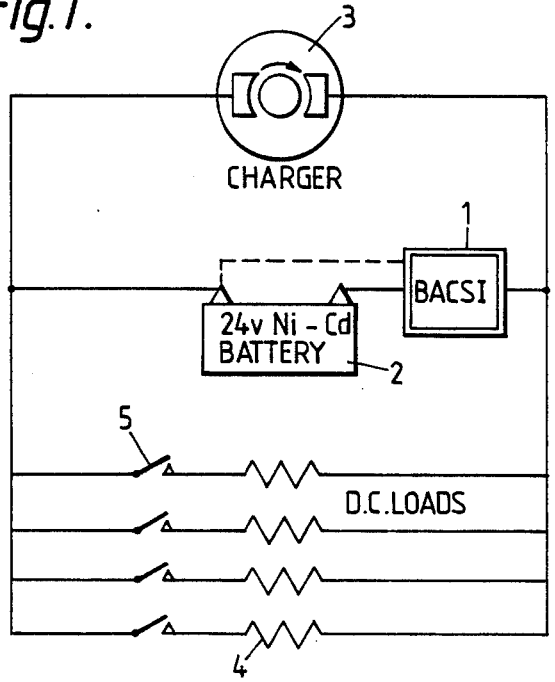
FIG. 1 is block diagram of a battery powered system including the present invention.
Figure 3:
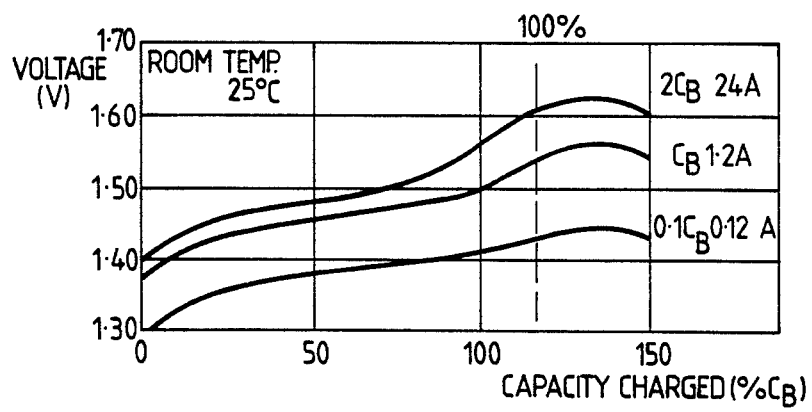
FIG. 3 is a graph showing how the voltage of a nickel-cadmium cell,, varies with its state of charge when the cell is being charged at three different rates.
Figure 2:
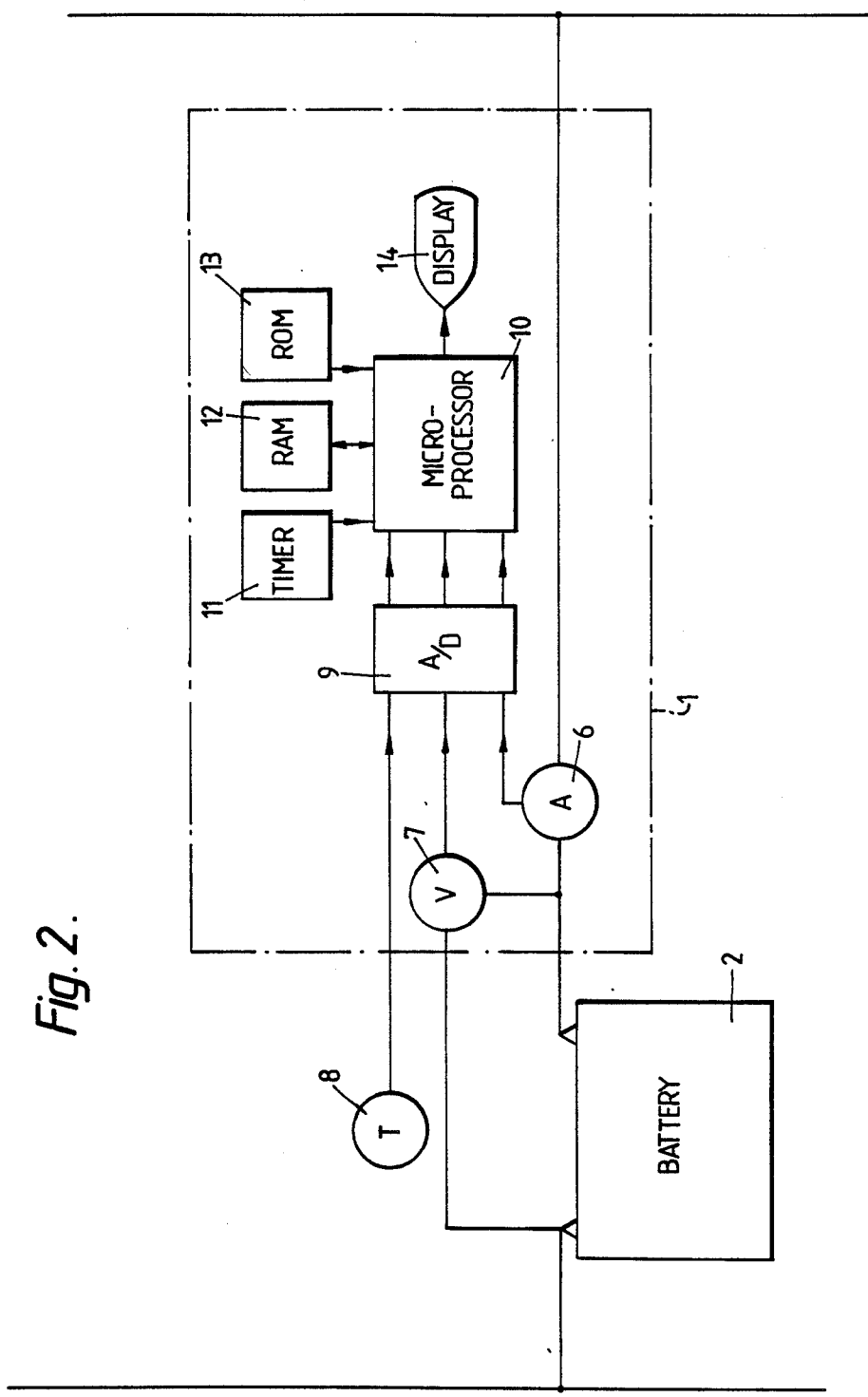
FIG. 2 is a block diagram of the present invention.
Figure 4:
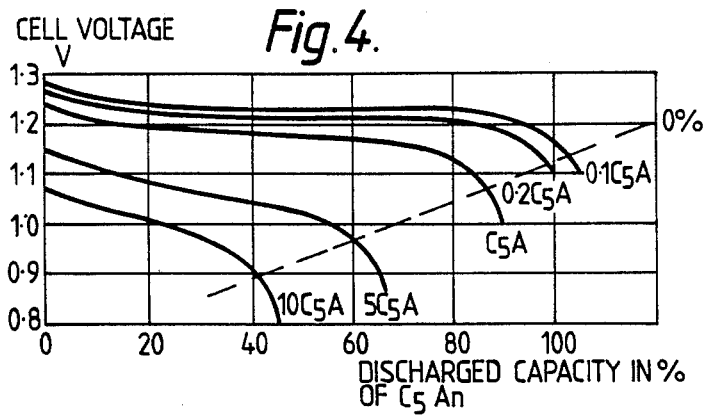
FIG. 4 is a graph showing how the cell voltage of a nickel-cadmium cell varies with capacity as the cell is discharged at different rates.
Figure 5A:
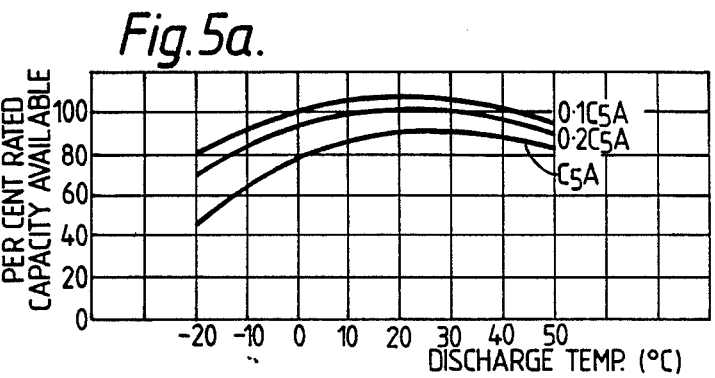
FIGS. 5A, B and C are graphs showing how the capacity of nickel-cadmium cells vary with temperature at different discharge rates and with different constructions of cell.
Figure 5B:
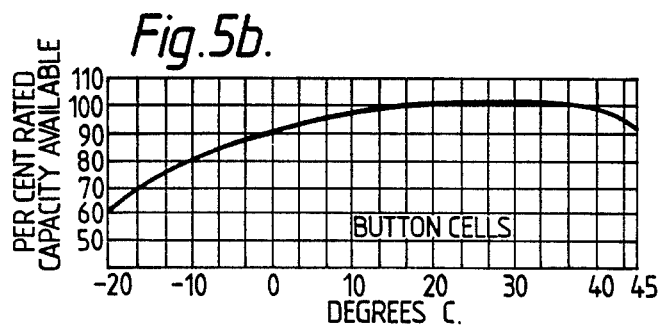
Figure 5C:
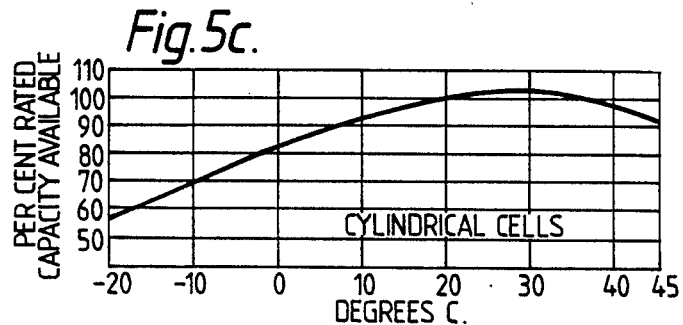
Figure 6:
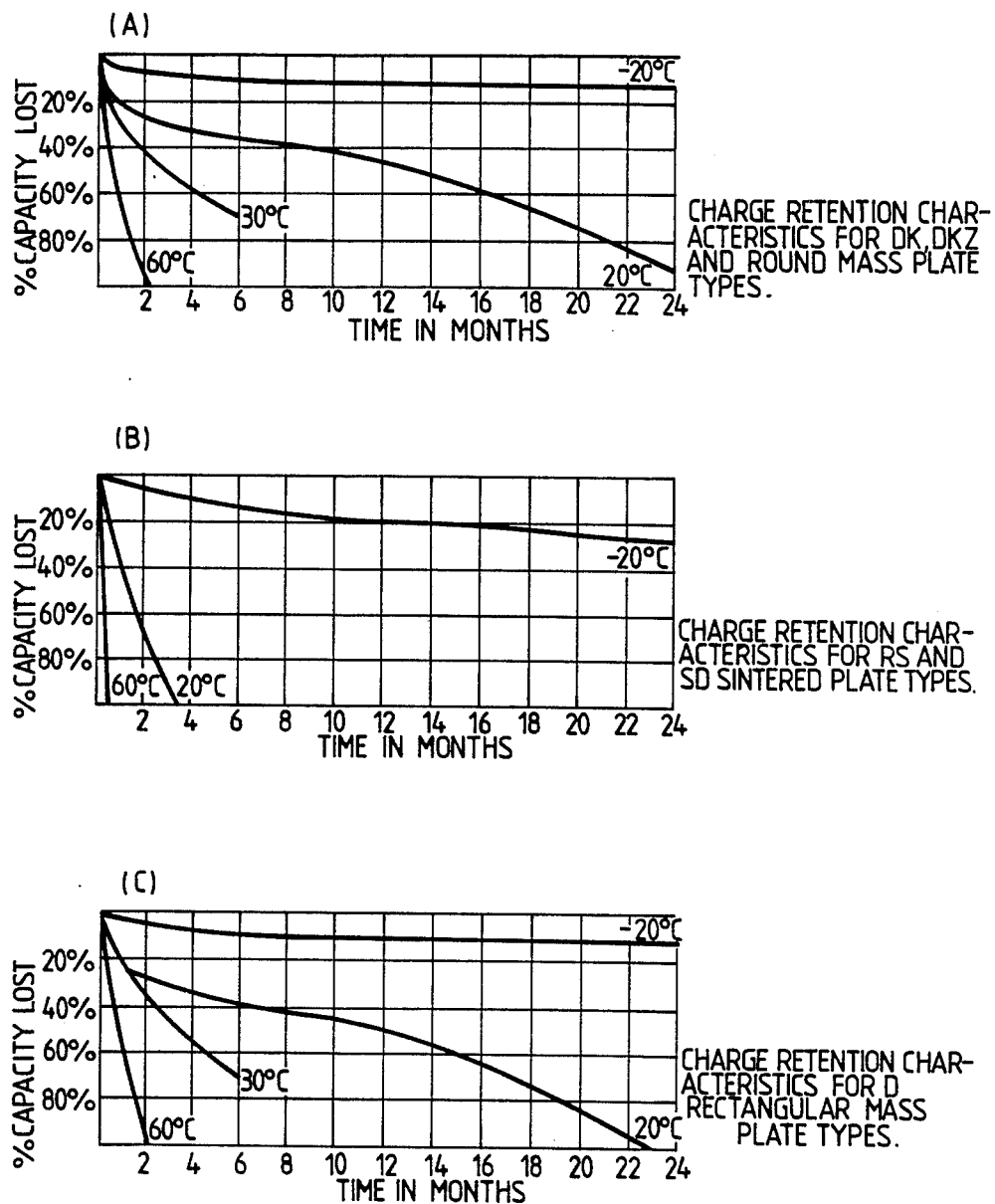
FIGS. 6A, B and C are graphs showing how the charge held different types of nickel-cadmium cell decays temperature and time.

FIG. 1 shows a state of charge indicator 1 in accordance with this invention connected in series with a nickel-cadmium battery 2. The remainder of the system includes a charger 3 and various load circuits 4 which are connected across the battery 2 by switches 5. The battery state of charge indicator is shown in more detail in FIG. 2 and has a current sensor 6, a voltage sensor 7 and an input from a temperature sensor 8, which are fed via an analogue to digital converter 9 into a microprocessor 10. The microprocessor 10 is also connected to a timer or internal clock 11, a random access memory 12 and a read only memory 13. An output from the microprocessor leads to a display 14 and a further output, not shown, leads to a remote display.

The current sensor 6 measures the current flow magnitude and its direction and typically measures this by use of the Hall effect on currents in a non-intrusive loop located around a main current carrying cable attached to the battery terminals. The current sensor 6 typically has a dynamic measurement range of 10,000 to 1 so that it can measure accurately both short period large currents and long period trickle currents. The voltage sensor 7 is a typical high impedance voltage measuring device of very limited range that typically has a dynamic measurement range of less than 10 to 1. The voltage fluctuation between the extreme cases of the battery 2 being fully charged and fully discharged is only a matter of fractions of a volt for each cell of the battery. The temperature sensor 8 is mounted adjacent the case of the battery to provide as accurate an indication of the temperature of the battery as possible and is typically formed by a bimetallic thermocouple having a temperature range from $-50°$ C. to $+100°$ C. to cover the extreme working conditions likely to be encountered by the battery 2.

Typically the timer 11 forms part of the computer but it may be formed by an independent quartz crystal controlled oscillator with associated electronic counters to provide output pulses at the required repetition frequency. Typically the timer 11 produces an output pulse ten times per second. Again the RAM 12 and ROM 13 may form part of a conventional computer. The ROM 13 is loaded with the nominal battery characteristics and the programme to control the operation of the microprocessor 10. The RAM 12 contains the updated information on the current state of charge in the battery and the results of the computations formed by the microprocessor 10. The display 14 typically is a liquid crystal or a light emitting diode type of display capable of displaying several alpha-numeric figures but, alternatively, it may be a simple red/green indicator which displays a green indication when the charge contained in the battery is adequate and a red indication to indicate that the battery is nearly discharged, or in need of replacement. Preferably the display 14 displays the state of charge of the battery as a nominal percentage of its total capacity and it may also display the health of the battery by displaying the time before the battery has to be changed.

FIGS. 3, 4, 5 and 6 display typical performance curves for a nickel-cadmium battery. It is information such as that contained in these graphs which is stored in the ROM 13 and used to represent the typical characteristics of the battery 2.

FIG. 7 is a flow chart of the program loaded in the ROM 13 in a first embodiment of the present invention. At the beginning (step 100) of each cycle the data representative of the voltage V, the current A and the temperature T° are read (step 101) from the current sensor 6, the voltage sensor 7 and the temperature sensor 8 via the analogue to digital converter 9, and the time t is read from the timer 11. Subsequently a look-up table stored in the ROM 13 is addressed (step 102) to find the $V_{max}$ $V_{min}$, and the voltages corresponding to the fully charged and fully discharged states respectively of the battery for the read values of A and T° . The voltage V is then compared (step 103) with $V_{min}$. If V is less than or equal to $V_{min}$, then a variable C corresponding to the capacity of the battery is set (step 104) equal to $C_0$ the capacity after complete discharge, the state of charge is then displayed (step 105) and the program then returns (step 106) to the start of the cycle. If V is greater than $V_{min}$ it is then compared (step 107) with $V_{max}$. If V is greater than or equal to $V_{max}$, C is set (step 108) equal to $C_{100}$ the capacity of a fully charged battery, the state of charge is then displayed (step 105) and the program returns (step 106) to the start of the cycle. If V falls between $V_{min}$ and $V_{max}$ the program executes a series of steps to calculate the magnitude and size of the change of charge stored in the battery. The value of the capacity C of the battery for the read values of A and T° (step 109), and the value of the charge leakage for the given value of T° (step 110), are read from look-up tables stored in the ROM 13. These data are then used to calculate (step 111) the magnitude of the change in the charge of the battery. If A is positive (step 112) this calculated change is added (step 113) to the value of the battery's total charge stored in the RAM 12. If A is negative (step 114) then the calculated change is subtracted (step 115). The newly calculated value of the total charge is stored (116) and the stat of charge displayed (step 105). The cycle is then repeated (step 106).

FIG. 8 is a flow chart of a program used in a preferred embodiment of the present invention. This program includes additional steps to provide increased accuracy and to enable the calculation of a measure of the health of the battery. When V is found to be less than or equal to $V_{min}$ or greater than or equal to $V_{max}$ then as before C is set equal to $C_0$ or $C_{100}$. In addition either of these known values of the battery capacity is compared (step 200) with the value of C calculated by the program. The magnitude of any discrepancy between these values is used to calculate updated values for C as a function of A and T° (step 201) and the charge leakage as a function of T° (step 202). These updated data are stored in the RAM 12. Since the magnitude of this discrepancy is indicative of the departure of the battery from ideal characteristics it may be used to calculate (step 203) a measure of the health of the battery. This measure conveniently takes the form of the remaining "life" of the battery and is displayed (step 204) to aid maintenance of the battery system. In subsequent cycles the program instead of just reading standard values of the capacity C (step 205) and the charge leakage (step 206) from look-up tables held in the ROM 13 obtains updated values using the data stored in the RAM 12 and is thereby able to calculate the state of charge of the battery with increased accuracy. In subsequent cycles the updated data stored in the RAM may again be corrected according to the magnitude of the discrepancy between known and calculated values of C. Thus over a number of cycles the system "learns" the actual characteristics of the battery rather than relying upon nominal characteristics.

I claim:

1. A combination of a battery and a device for indicating a state of charge of said battery, comprising:
    a Ni-Cad battery including input/output terminals;
    a current sensor operatively connected to said input/output terminals and arranged to provide an output indicative of magnitude and direction of a current flow from said Ni-Cad battery;
    a voltage sensor operatively connected to said input/output terminals and arranged to sense a potential difference subsisting across said input/output terminals;
    timing means arranged to provide a time signal;
    data storage means for storing an indication of a state of charge of said battery; and
    computer means for determining said state of charge of said battery operatively connected to said current sensor, to said voltage sensor, to said timing means, and to said data storage means, said computer including:
    means for computing from the output of the current sensor and the timing means a signal representative of a change in a state of charge of said battery over a period of time,
    means for supplying to said data storage means a signal representative of said change in said state of charge of said battery to update stored data on said state of charge of said battery to provide an indication of the current state of charge of said battery,
    means for monitoring an output signal of said voltage sensor and, when the monitored voltage reaches a predetermined maximum value to reset said data storage means to indicate that said battery is fully charged and, when said battery is fully charged and when said monitored voltage reaches a predetermined minimum value, to reset said data storage means to indicate that said battery is fully discharged, and
    means for comparing the state of charge indication immediately before it is reset at one of said predetermined maximum and minimum values with the state of charge indicated by the voltage sensor when the indication is reset when the battery is one of fully charged and fully discharged, respectfully, and to use the results of this comparison to vary at least one parameter to tailor said at least one parameter to the connected battery.

2. A device, indicating a state of charge of a Ni-Cad battery having input/output terminals comprising:
    a current sensor operatively connected to said input/output terminals and arranged to provide an output indicative of magnitude and direction of a current flow from said Ni-Cad battery;
    a voltage sensor operatively connected to said input/output terminals and arranged to sense a potential difference subsisting across said input/output terminals;
    timing means arranged to provide a time signal;
    data storage means for storing an indication of a state of charge of said battery; and
    computer means for determining said state of charge of said battery operatively connected to said current sensor, to said voltage sensor, to said timing means, and to said data storage means, said computer including:
    means for computing from the output of the current sensor and the timing means a signal representative of a change in a state of charge of said battery over a period of time,
    means for supplying to said data storage means a signal representative of said change in said state of charge of said battery to update stored data on said state of charge of said battery to provide an indication of the current state of charge of said battery,
    means for monitoring an output signal of said voltage sensor and, when the monitored voltage reaches a predetermined maximum value to reset said data storage means to indicate that said battery is fully charged and, when said battery is fully charged and when said monitored voltage reaches a predetermined minimum value, to reset said data storage means to indicate that said battery is fully discharged, and means for comparing the state of charge indication immediately before it is reset at one of said predetermined maximum and minimum values with the state of charge indicated by the voltage sensor when the indication is reset when the battery is one of fully charged and fully discharged, respectfully, and to use the results of this comparison to vary at least one parameter to tailor said at least one parameter to the connected battery.

3. A combination according to claim 1, in which said at least one parameter includes the conversion efficiency.

4. A combination according to claim 1, which includes a temperature sensor having an output indicative of the temperature of at least one of the battery and its surroundings, and in which the computer means includes means for modifying modify the state of charge indication to take account of the effect of the temperature on the battery.

5. A combination according to claim 1, which includes a display device to provide an indication of the available battery capacity.

6. A combination according to claim 1, in which the computer means includes means for applying a correction factor based on conversion efficiency to both the monitored charge accumulated in the battery and the monitored charge dissipated from the battery.

7. A combination according to claim 6, further including a temperature sensor having an output indicative of the temperature of at least one of the battery and its surroundings, and in which the computer means includes means for modifying the state of charge indication to take account of the effect of the temperature on the battery, and wherein said applying means take into account both the magnitude of the current being accumulated in and dissipated from the battery and the output of the temperature sensor when applying the correction factor to both the monitored charge accumulated in the battery and the monitored charge dissipated from the battery.

8. A device according to claim 2 in which said at least one parameter includes the conversion efficiency.

9. A device according to claim 8, which includes a temperature sensor having an output indicative of the temperature of at least one of the battery and its surroundings, and in which the computer means includes means for modifying the state of charge indication to take account of the effect of the temperature on the battery.

10. A device according to claim 2, which includes a display device to provide an indication of the available battery capacity.

11. A device according to claim 2, in which the computer means includes means for applying a correction factor based on conversion efficiency to both the monitored charge accumulated in the battery and the monitored charge dissipated from the battery.

12. A device according to claim 11, further including a temperature sensor having an output indicative of the temperature of at least one of the battery and its surroundings, and in which the computer means includes means for modifying the state of charge indication to take account of the effect of the temperature on the battery, and wherein said applying means take into account both the magnitude of the current being accumulated in and dissipated from the battery and the output of the temperature sensor when applying the correction factor to both the monitored charge accumulated in the battery and the monitored charge dissipated from the battery.

* * * * *